United States Patent [19]

Mouissie

[11] 4,248,491

[45] Feb. 3, 1981

[54] END CONNECTOR FOR FLEXIBLE PRINTED CIRCUITS

[75] Inventor: Bob Mouissie, Berlicum, Netherlands

[73] Assignee: E. I. Du Pont de Nemours and Company, Wilmington, Del.

[21] Appl. No.: 52,929

[22] Filed: Jun. 27, 1979

[30] Foreign Application Priority Data

Aug. 18, 1978 [NL] Netherlands ........................ 7808579

[51] Int. Cl.[3] ............................................... H05K 1/04

[52] U.S. Cl. ........................... 339/17 F; 339/176 MF

[58] Field of Search ........................ 339/17 F, 176 MF

[56] References Cited

U.S. PATENT DOCUMENTS

| | | | |
|---|---|---|---|
| 3,090,028 | 5/1963 | Hall et al. | 339/17 F |
| 3,760,334 | 9/1973 | Bridle | 339/17 F |
| 3,848,946 | 11/1974 | Halley et al. | 339/17 F |
| 4,109,986 | 8/1978 | Mouissie | 339/17 L |

FOREIGN PATENT DOCUMENTS

| | | | |
|---|---|---|---|
| 2164280 | 7/1973 | Fed. Rep. of Germany | 339/176 MF |
| 1214316 | 12/1970 | United Kingdom | 339/176 MF |
| 1419416 | 12/1975 | United Kingdom | 339/176 MF |

*Primary Examiner*—Neil Abrams

[57] ABSTRACT

An end connector for flexible printed circuits, with a folding casing of insulating material. The connector is suitable to receive and contact through contact means the edge part provided with parallel conducting strips of a flexible circuit. The bottom of the casing contains a resilient means and cams for positioning the flexible circuit in the connector.

4 Claims, 6 Drawing Figures

END CONNECTOR FOR FLEXIBLE PRINTED CIRCUITS

BACKGROUND OF THE INVENTION

1. Field of the Invention

This invention relates to end connectors for flexible printed circuits. More particularly, it relates to a connector having a folding casing with a bottom and a lid intergrally connected on one side. The lid pivots at the one side with respect to the bottom and clamps an edge part of a flexible circuit.

2. Description of the Prior Art

Connectors for flexible printed circuits are well known. However, in the prior art connectors the actual casing comprises contact means for the individual conducting strips of a flexible circuit or flat cable, which contact means are soldered to a printed circuit board for the contacting. In order to contact a flexible circuit or flat cable with this printed circuit, the bare part of the flexible circuit is inserted into the casing, so that the respective contact strips come to lie on the respective contact means, and subsequently the pivoting lid is closed, so that a comb-shaped pressing means presses the contact strips of the flexible circuit or cable against the respective resilient contact means.

Such a device as an end connector is limited in its possibilities and is rather vulnerable because of the great force that has to be exerted to clamp the lid, in order to efficiently obtain the relatively great contact pressure. Moreover, contact deformation at the contact places may occur easily in such a contact system. Furthermore, such embodiments are rather expensive, as the materials of the casing and the lid must be very solid (e.g., fiber-reinforced polyester). Also the contacts mounted in the casing must be relatively strong. A further drawback, which will be explained later, is that the assembly of a flexible circuit is possible only with contact means already in position in the casing. It is the purpose of the present invention to show the construction of an end connector that has none of the above-described drawbacks and is easy to assemble and to take apart, is universal in its applications, and is inexpensive and easy to manufacture in mass production.

SUMMARY OF THE INVENTION

The end connector according to this invention is characterized in that the housing is a folding housing, consisting of a bottom and a lid pivoting at its rear side and integrally connected therewith, between which an edge part of a flexible circuit can be clamped.

The bottom almost adjacent to its pivoting rear side has a pre-tensioned composite resilient means with a row of resilient segments. More to the open front side is a row of cams serving for the correct positioning of the edge of the flexible circuit in which corresponding positioning holes have been provided beforehand in such a way that the parallel conducting strips of the flexible circuit come to lie on the resilient segments meant for that purpose.

The lid contains holes which correspond with the cams in the bottom. The cams can be locked in the lid holes. The lid has at its pivoting rear side a thickened edge with therein a row of receiving channels in line with the respective row of resilient segments, for contact means, so that when the lid is closed on the bottom, the thickened rear edge spans a positioned flexible circuit edge over the composite resilient means. This assures a correct contact pressure for contacting with contact means to be placed or already placed in the receiving channels.

DESCRIPTION OF THE DRAWINGS

FIG. 1(*a*) is a plan view of a resilient contact means before its placement into the bottom of the connector housing. Each segment is tapered towards its midpoint.

Figure 1:
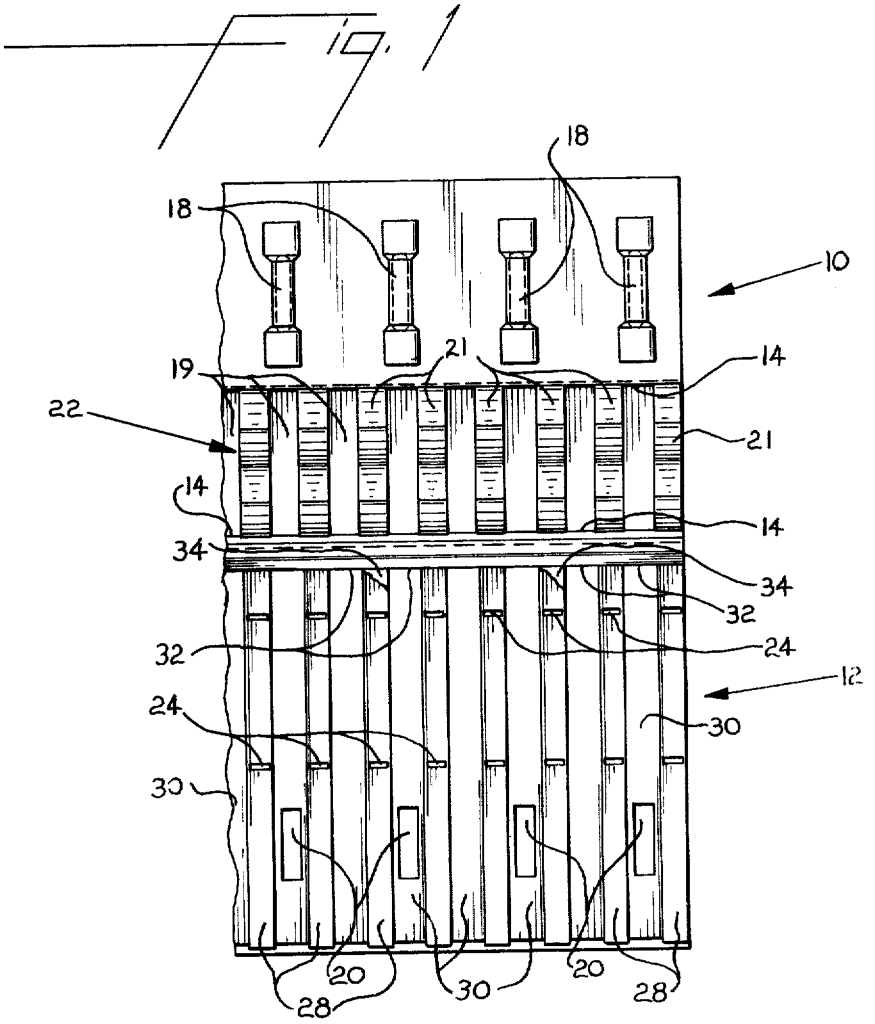
FIG. 1 is a plan view of the connector before it receives the flexible printed circuit.
Figure 1A:
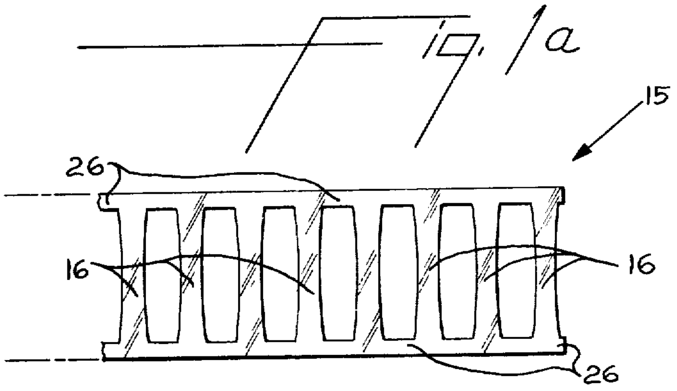

As the drawings show, the folding casing consists of a bottom 10, which is connected in a pivoting way with a lid 12, at the front side 13. This folding casing is made of one single piece of flexible hard plastic, the folding edge being made thinner to assure a flexible pivoting. The casing bottom 10 has, parallel to the pivoting side, a longitudinal receiving space 22 for a composite resilient means 15, which receiving space is limited by two oppositely situated parallel lateral walls 14. The bottom of this receiving space has a cammed undulating pattern having a trough and two crests. This bottom profile serves for a correct guiding of the resilient means during the contacting. This undulating bottom is subdivided by partitions 19 into a number of parallel receiving spaces 21.

The resilient means 15 has a ladder-shaped construction with two lateral strips 26, interconnected by tapered cross segments 16, which are regularly interspaced. This ladder-shaped resilient means has a width greater than the distance between the lateral walls 14 of the receiving space 22 and is spanned in this receiving space with the lateral strips 26 between the lateral walls 14 of the receiving space. The cross segments 16 are spanned in the shape of an arc. Also the dimension of the ladder-shaped resilient means with respect to the receiving space is chosen in such a way, that the arc-shaped cross segments 16 of the resilient means comes to lie in each receiving space 21.

The casing bottom 10 further has a row of locking cams 18, situated at regular mutual distances parallel to the rear edge of the bottom and in such a way, that each cam is situated in the prolongation of a partition 19.

In the lid 12, which is connected with the bottom 10, there are shallow guiding channels 28 between parallel partitions 30. The channels 28 in the closed position of the folding casing are in line with the receiving spaces 21 in the bottom 10. At the pivot side of the lid these partitions 30 merge into a thickened rear part 32, whereas the guiding channels form into square holes 34, through which contact pins 36 (FIG. 2) can be put, or from which pin parts of a contact means can project. The guiding channels 28 further have holes 24, meant to receive side ends 38 of a contact means or contact pin 36.

The partitions 30 in the lid 12, which partitions are in line with the partitions 19 in the bottom 10, further have locking holes 20, which correspond with the cams 18 in the bottom in such a way, that when the lid is closed on the bottom, each cam 18 is put into and locked in the corresponding locking hole 20.

It will be explained now how the above-described folding casing construction works. Holes 40, corresponding with the cams 18 in the bottom of the contact casing are punched beforehand in the edge part of a flexible circuit 41 to be contacted. The flexible circuit consists of a flexible foil on a synthetic material with a pattern of parallel conducting strips 42 thereon; e.g., gold or gilded metal. The foil is placed then on the lid, the locking cams 18 of the bottom projecting through the positioning holes 40 in the foil. In this way it can be assured that the foil is placed in the right way, so that each conducting strip 42 of the foil comes to lie above a corresponding cross segment 16 of the resilient means 15. At the pivot side, the foil comes to lie in the fold groove 13 of the pivot connection. Then the folding casing is closed, so that the cams 18 are closed in the locking holes 20 of the lid. The foil is now spanned in the right way between the fold groove 13 and the locking cams 18, which, as will be obvious, have a triple function, namely the locking of the casing, the positioning and spanning of the foil and a pull relief for the non-spanned part of the flexible circuit.

If contact pins 36 are inserted through the pin insertion holes 34, these pins, while being slid inwards over the guiding grooves 28, will first partly dent the corresponding resilient cross segments with relatively small resilient force and will be guided by the undulating pattern of the receiving space 21. The resilient means 15 at a negative resilient characteristic is dented to a final position, in which each resilient segment 16 shows a trough in its middle and two crests therearound, giving a strong contact pressure at two contact places on the respective conducting strips 42 of the flexible circuit. The denting movement of the resilient means is guided efficiently by the bottom profile of 21. This method with its relatively small resilient pressure at the insertion of a pin, but resulting in a strong contact pressure at two contact points, is the same as the method of the resilient segment contact described in U.S. patent application Ser. No. 919,738 filed June 27, 1978 (now abandoned) in favor of continuation-in-part application Ser. No. 068,350 filed Aug. 21, 1979. In the present case, however, that already known insight is applied efficiently for contacting a flexible circuit.

In the above described case a female contact is thus obtained, that is an end connector, into which pins for further contacting can be inserted.

Figure 2:
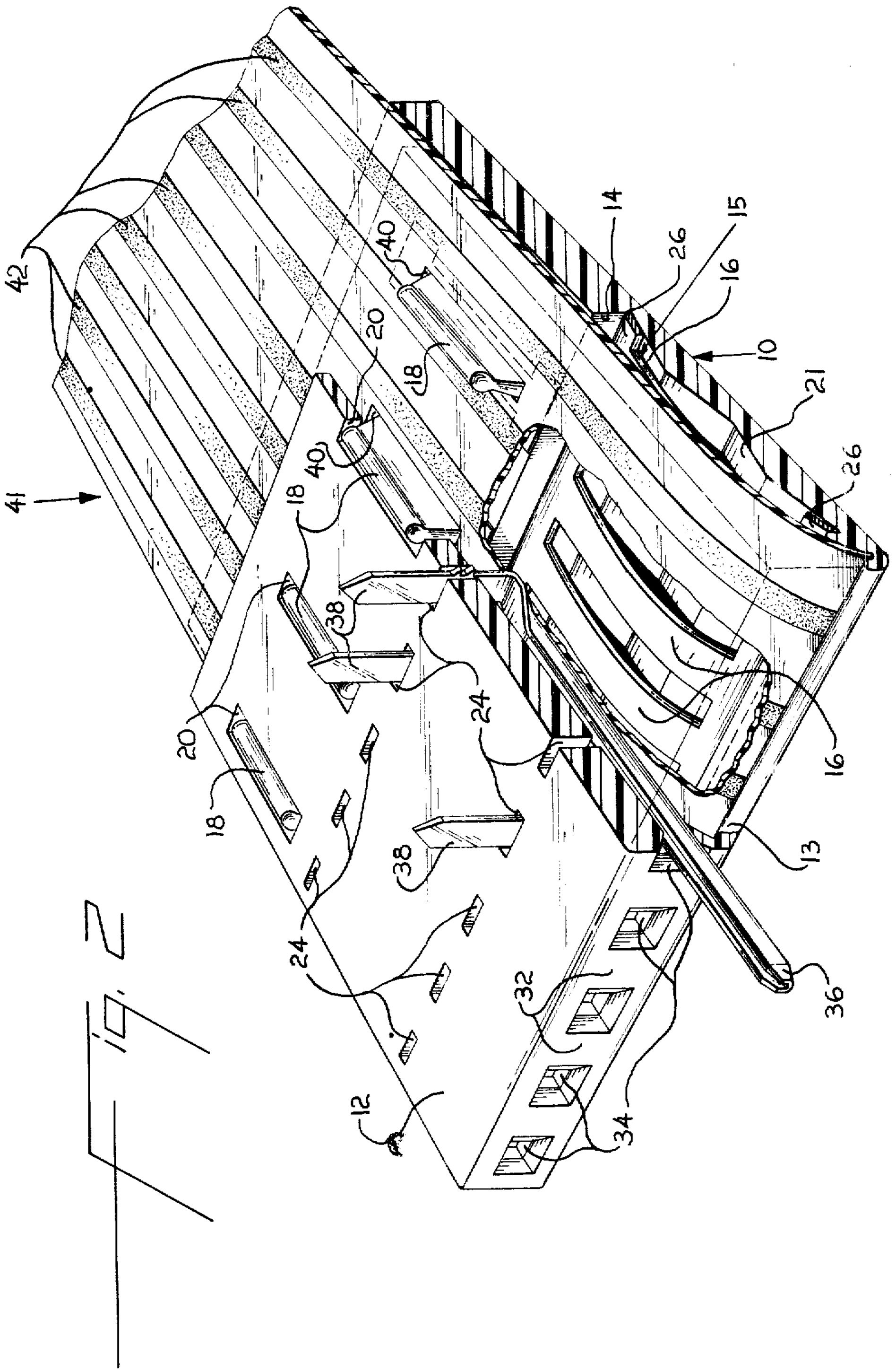
FIG. 2 is a cut away perspective view of the connector in the closed position with the flexible printed circuit inserted between the top and bottom portions of the housing. The resilient means is shown in its pretensioned position.

It is also possible, however, to provide the folding casing construction with different contacts; e.g., with side ends 38 as shown in FIG. 2, which project from the lateral holes 24. In that case, the contact means must be inserted in the lid when the casing is opened, and the contacting between the flexible circuit and these contact means is obtained by closing the lid. In the embodiment shown in FIG. 2, a male contact is thus obtained, that is a plug contact, with which pins project from the folding casing contact for further contacting. The side ends 38 may efficiently constitute soldering contacts.

A third possiblity of using the folding casing construction according to the invention is the contacting of two flexible circuits to each other. In that case, two previously punched circuits must be brought with the conducting strips towards each other into the folding casing in the earlier described way, whereafter this casing is closed. Thus the contacting of the one flexible circuit to the other is achieved.

Figure 3:
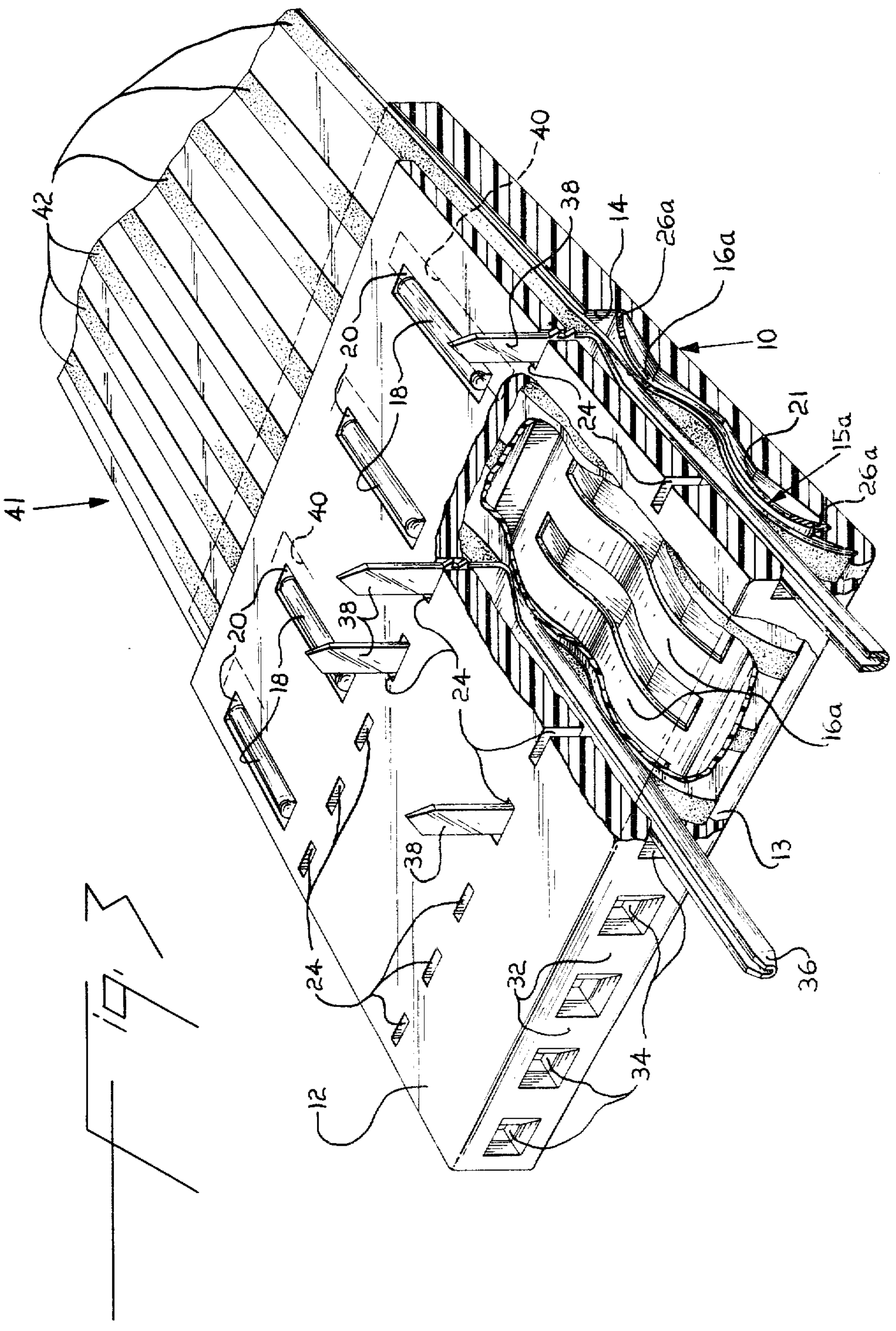
FIG. 3 is a cut away perspective view of the connector in the closed position with the flexible printed circuit inserted between the top and bottom portion of the housing. The resilient means is shown in its stressed position.
Figure 4:
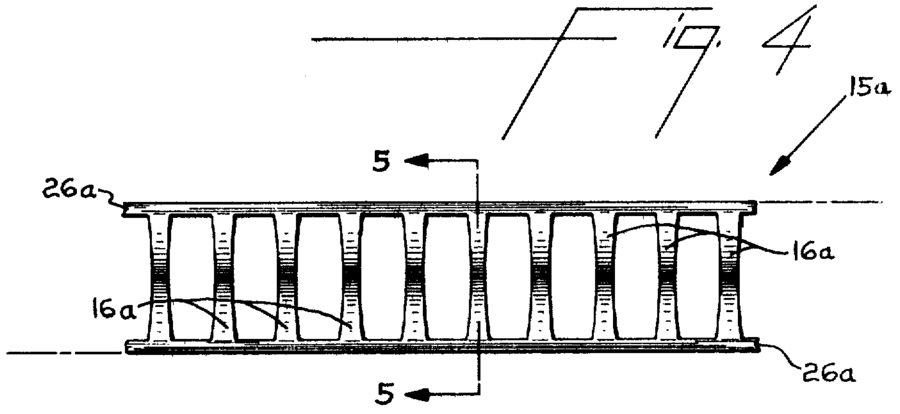
FIG. 4 is a plan view of a preferred resilient contact means partially formed in its stressed condition.
Figure 5:
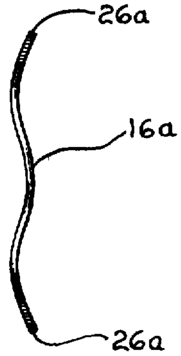
FIG. 5 is a view of the resilient contact of FIG. 4 along cut 5—5.

FIGS. 3 and 4 show an alternative resilient means 15(*a*) that has a preformed undulating pattern in its tapered cross segments 16(*a*). Its use in the connector of FIG. 3 provides an improved contact pressure at the two contact points.

The pivoting lid according to the invention does not have a direct contact pressure function by clamping action, but the closing of the lid assures primarily that the flexible circuit is held efficiently in the housing. The resilient means placed in the bottom assures the actual contact pressure, in that by this means the individual conducting strips are pressed against corresponding contact means. The thickened edge part of the lid at the rear side efficiently assures that the flexible circuit is pressed downwards there against the resilient means, whereas on the other hand the positioning and the fixation are determined by the cams in the bottom. These cams, which are locked in the corresponding holes in the lid, furthermore give an efficient pull relief for the relatively vulnerable flexible circuit.

Furthermore, the casing need not resist the great forces of clamping so that an embodiment is possible in the shape of a folding casing made out of one single piece, which folding casing is easy and inexpensive to manufacture in mass production.

An important advantage of the invention is that the contact means need not in all cases have been assembled already before the flexible circuit is assembled. To achieve this, it is necessary only that the receiving channels in the thickened rear edge of the lid form into plug holes in the rear surface of the casing, through which contact plug means can be put. In this way an end connector is obtained, which after having been secured on a connecting edge of a flexible circuit, can be used directly as female plug contact. If necessary, however, also loose plug pins can be put into these plug holes, so that a plug contact is obtained.

For guiding contact plug pins which have been put through these plug holes, it is furthermore particularly efficient, that the receiving channels in the lid extend themselves towards the front in guiding slots which are in the prolongation thereof, so that a good orientation of the pins throughout the device is assured.

In particular with the above application, where plug pins are inserted after the flexible circuit has been assembled already, the invention provides an efficient resilient means, which assures a contact pressure to be overcome gradually. To that end the invention is characterized in that the composite resilient means has a ladder configuration with two lateral strips, interconnected by a row of regularly interspaced cross segments, and that in the bottom near the rear side thereof two erect supporting edges parallel with the rear side have been formed, between which supporting edges the resilient means with its lateral strips is clamped in such a way that, when the lid is closed, there is an arc-shaped erect cross segment of the resilient means behind each receiving channel. These arc-shaped spans constitute, as it were, for each conducting strip an individual resilient means, which, when a plug penetrates through a plug hole, will be bent inwards gradually and is then dented partly, thus overcoming a negative resilient resistance, so that the pins can be inserted relatively easily and yet, after they have been slid over the resilient arc, undergo an efficient contact pressure on two contact places, as a result of the fact that the resilient means is dented when the pin is slid through.

As the resilient means in the present invention has no direct contact function, the resilient properties thereof can be chosen optimally, so that in any condition an efficient contacting is assured.

In order to assure a correct positioning of the resilient cross segments with respect to the guiding in the lid, it is preferable furthermore, that in the bottom between the two supporting edges parallel and equally interspaced cross walls are formed, of which each two adjacent cross walls define an insertion place for an arc-shaped spanned cross segment of the resilient means, and that the bottoms of these insertion places have a double undulating length profile with a trough in the middle and two crests therearound. This profile assures a good bent guiding of the denting resilient means.

As observed above, the end connector according to the invention is particularly suitable for universal use, since it can be used as a plug, as a female plug and also as a soldering contact means. In connection with the latter, holes may be provided in the lid in the prolongation of the receiving channels, respectively in the guiding slots, through which holes lateral ends of contact means in the shape of pins or soldering means can be guided. These lateral ends may also have a fixation function for retaining for fixed contact means which have been brought in the lid beforehand. These contact means may be relatively short, so that only the lateral ends are used as soldering means, but it is also possible to use long contact pins with lateral ends, in which case the connector constitutes at the same time a soldering contact and a plug contact.

It will be obvious that the above-described embodiment does not cover exclusively all possibilities of the invention. Numerous variations are possible and will be obvious to the expert, after he has taken knowledge of the above.

I claim:

1. In an end connector for a flexible printed circuit board having a hinged unitary moldable dielectric housing, said hinge separating a lid and bottom portion of said housing and an edge part of a flexible circuit between said lid and bottom in the closed position, the improvement comprising:

a. in the bottom of said housing, a pretensioned multi-segmented spring located in a longitudinal receiving space parallel to said hinge, partitions separating the segments of said spring in said receiving space and a row of locking cams outside said receiving space, each cam in line with a partition and;
b. in the lid of said housing, lid holes corresponding in location to said cams in the bottom of said housing, said lid holes receiving said cams when the housing is in the closed position, a thickened edge parallel to said hinge containing a row of pin receiving holes leading to pin guiding channels which correspond in location to the segments of said springs in the bottom of said housing.

2. A connector according to claim 1 wherein the portion of the housing bottom under the spring segments has an undulating profile.

3. A connector according to claim 1 wherein the guiding channels having openings for receiving electrical contact means.

4. A connector according to claim 1 wherein the spring is ladder shaped and each segment contains a trough and two crests.

* * * * *